(12) United States Patent
Weekamp

(10) Patent No.: US 7,414,858 B2
(45) Date of Patent: Aug. 19, 2008

(54) METHOD OF MANUFACTURING AN ELECTRONIC DEVICE

(75) Inventor: Johannus Wilhelmus Weekamp, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 408 days.

(21) Appl. No.: 10/510,298

(22) PCT Filed: Apr. 10, 2003

(86) PCT No.: PCT/IB03/01302

§ 371 (c)(1),
(2), (4) Date: Oct. 6, 2004

(87) PCT Pub. No.: WO03/085729

PCT Pub. Date: Oct. 16, 2003

(65) Prior Publication Data

US 2005/0117315 A1    Jun. 2, 2005

(30) Foreign Application Priority Data

Apr. 11, 2002 (EP) ................... 02076425
Oct. 30, 2002 (EP) ................... 02079546

(51) Int. Cl.
*H01R 9/00* (2006.01)
(52) U.S. Cl. ...................... 361/772; 174/261
(58) Field of Classification Search .............. 174/258, 174/260; 361/760–766
See application file for complete search history.

(56) References Cited

U.S. PATENT DOCUMENTS

| 4,992,764 A | * | 2/1991 | Ayasli | 333/247 |
| 5,404,571 A | * | 4/1995 | Makowski | 370/337 |
| 5,635,762 A | | 6/1997 | Gammand | |
| 5,949,140 A | * | 9/1999 | Nishi et al. | 257/728 |
| 6,060,968 A | | 5/2000 | Baltus | |
| 6,563,214 B2 | * | 5/2003 | Yamada et al. | 257/730 |
| 6,608,757 B1 | * | 8/2003 | Bhatt et al. | 361/748 |
| 6,801,438 B1 | * | 10/2004 | Castro | 361/765 |
| 6,882,544 B2 | * | 4/2005 | Nakamura et al. | 361/765 |

FOREIGN PATENT DOCUMENTS

| EP | 1 154 473 A2 | 11/2001 |
| EP | 1 187 205 A2 | 3/2002 |
| WO | WO 02/01631 A2 | 3/2002 |
| WO | WO 03/017479 A2 | 2/2003 |
| WO | WO 03/086037 A1 | 10/2003 |
| WO | WO 03/105213 A2 | 12/2003 |

* cited by examiner

*Primary Examiner*—Dean A. Reichard
*Assistant Examiner*—Abiy Getachew
(74) *Attorney, Agent, or Firm*—Paul Im; Michael E. Belk

(57) ABSTRACT

A semiconductor device (100) comprising a semiconductor substrate (20) and a functional element (31), such as a microstrip, an inductor, a coupler or the like, is provided. Herein the functional element (31) is—at least partially—present in a conductive patterned layer that is mechanically embedded in isolating material (40) and that is connected to the substrate (20) through connection means. In this way, electrical losses through the substrate (20) are substantially reduced. The device (100) is provided in that a foil comprising the patterned layer and a carrier layer is applied to the substrate (20), after which the space between them is filled with the isolating material (40) and the carrier layer is removed.

9 Claims, 2 Drawing Sheets

METHOD OF MANUFACTURING AN ELECTRONIC DEVICE

Figure 1:
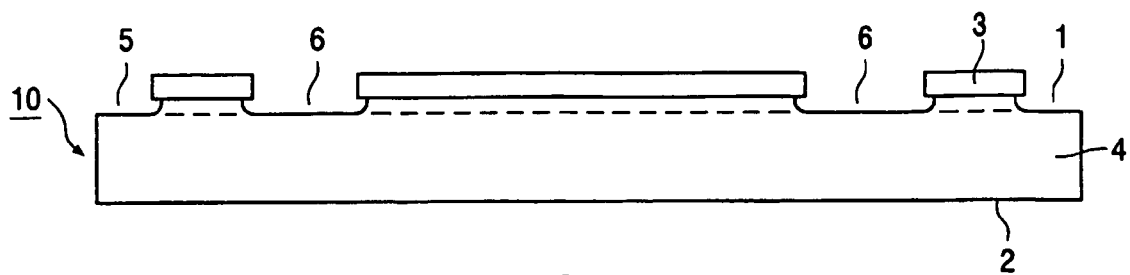

The invention relates to a method of manufacturing an electronic device comprising a substrate with an electrical element on a first side thereof, the electrical element comprising a first and a second electrode which are connected via metallization to electrical contacts and to electrodes of further electrical elements, the electronic device further comprising a functional element.

The invention relates to an electronic device comprising a substrate with an electrical element on a first side thereof, the electrical element comprising a first and a second electrode connected via a metallization to electrical contacts and to electrodes of further electrical elements, the electronic device further comprising an inductive element.

Such a device is known from U.S. Pat. No. 5,635,762. The known device comprises a semiconductor substrate with semiconductor elements. On the first side of the substrate are disposed transmission lines of the co-planar type and on a second side, turned away from the first side, transmission lines of the microstrip type. The transmission lines of the second side together form a coupler and are connected to the transmission lines on the first side by metallized links through the substrate (vias).

Although the presence of the coupler on the second side limits the use of space, the solution is not ideal. In the first place the metallized links impose marginal conditions on the design. For example, ground is to be applied to the first side, which causes voltage differences to arise between adjacent transmission lines, which differences are reckoned in. Secondly, the second side is only suitable for simple elements. Disposing a coil on the second side is limited, for example, by the inductive coupling of the semiconductor substrate. Thirdly, a substrate having functional elements on the first and second sides is highly sensitive to damage during transport and assembling by clients.

Therefore, it is a first object of the invention to provide a method of the type defined in the opening paragraph with which miniaturized and yet manageable devices can be obtained.

The first object is achieved in that the method comprises the steps of providing a carrier with the functional element, the carrier comprising on the first side an electroconductive patterned layer and on a second side facing the first side, comprising a carrier layer;

assembling the substrate and the carrier, the first sides facing each other, and the patterned layer being electroconductively connected to the metallization, and applying the isolating material between the substrate and the carrier.

By assembling the carrier on the first side of the substrate, the problem of manageability of the device during transport and mounting is solved.

The method has a further advantage in that it is simple because the carrier can be manufactured independently of the substrate. This also allows for using materials in or on the carrier which cannot be applied under the circumstances necessary for the manufacture of the electronic device, more particularly a semiconductor device.

Another advantage is that the resulting carrier is isolated from the substrate. Parasitic interactions through the substrate which would occur if the functional element were present on the substrate itself, can thereby be strongly reduced or even be substantially absent. In this respect one may think of, for example, coils on a semiconductor substrate which lead to problems due to crosstalk; transmission lines which show capacitive interaction with all kinds of other lines and surfaces; biosensors to which material starts to stick which may disturb the functioning of the electronic device; light-emitting diodes which are to be decoupled from photodiodes on the substrate.

In a favorable embodiment a patterned sub-layer is present in the carrier between the patterned layer and the carrier layer. The patterned layer and this sub-layer have a first and a second pattern, the patterns mutually being distinguished by a recess. This recess has a larger diameter in the surface of the sub-layer than in the surface of the patterned layer. Thanks to this non-constant diameter, the patterned layer of the carrier is embedded in the isolating layer material when this isolating material is applied. This provides reliable bonding which can sufficiently withstand pressure.

The functional element that is located in the carrier may comprise one or more layers. A single-layer element is, for example, an inductive element such as a coil, a waveguide, a single-layer coupler etc. A multilayer element is, for example, a microstrip or a strip line, but also a sensor, a light-emitting diode or another element to be disposed on the patterned layer. It is not necessary for the functional element to be located at least partly in the patterned layer. The patterned layer may also be applied as an interconnect layer. This is favorable, for example, when the functional element is a coil having a plurality of windings, the windings being located in a single layer. A first end of the coil is then located in the middle, a second end on the edge. By means of a via to the patterned layer this end may be contacted. The use of the patterned layer as an interconnect layer is furthermore advantageous when the functional element is a capacitor. The additional layers may be applied with thin-film processes after carrier and substrate have been assembled. On the other hand, these additional layers may also have been applied already during the manufacture of the carrier.

The patterned layer preferably contains Cu, but may also contain some other material such as Au, Ag, Fe—Ni. The carrier layer preferably contains Al, but may also contain some other material such as Fe—Ni or a suitable polymer. The only condition when a conducting carrier layer is used is that the carrier layer can be selectively removed relative to the patterned layer. The removal preferably takes place by etching, although other techniques may also be applied.

The isolating material is, for example, an epoxy material but, on the other hand, may also be another polymer material such as acrylate or polyimide, polyphenylenesulphide. Polysilicates as can be obtained with sol-gel processing of alkoxy silicates and alkyl substituted alkyl silicates are suitable. Use is preferably made of an isolating material which can be applied in the liquid phase and can thus fill the cavity between carrier and substrate. On the other hand a foil may be used which flows out from the substrate as a result of increased temperature and under pressure of connection means.

In a favorable embodiment the carrier layer is removed after the isolating material has been applied. The carrier layer thus acts as a temporary carrier that may be subsequently removed. The carrier layer which contains, for example, aluminum or otherwise an organic layer or a polymer may serve as a protective layer. It is also possible for holes to be defined in the carrier layer in a photolithographic way, which holes can be filled with electroconductive material. The removal, however, offers the advantage that when the carrier layer is selected, the desired functional properties of the layer need not be taken into account. Furthermore, additional layers can then be applied more easily to the roof of the cavity. Metal patterns in it are preferably connected to the patterned layer by means of vias. Removal takes place, for example, by means of etching, polishing or delaminating.

In a further embodiment bumps of a suitable material such as solder or a metal such as Cu, Ag, Au or Al are used for connecting the metallization with the patterned layer. The use of such bumps is known per se. The use of bumps is also suitable for the assembly according to the invented method, both as regards dimensioning and material. In addition, the carrier in the carrier layer has sufficient stability, which is necessary to have a good bonding of the bump. Otherwise anisotropically conducting glue can be applied.

It is advantageous for the invention when the patterned layer has a thickness between 1 and 20 μm. Such dimensions provide a very strong embedding in the isolating material. In addition, with such dimensions it is also possible to apply inductive elements and other patterns to relatively small devices. At the same time, a good quality factor of the inductive elements is realized with such thickness.

In a preferred embodiment the patterned layer is bent prior to the assembly so that, after assembly, there is contact between the metallization and the patterned layer at a first point, and that the functional element is situated in a plane substantially parallel to the first side at a predefined distance. Setting the distance between the transmission line layer and the substrate is highly advantageous in that the inductive and capacitive coupling can be set very accurately. Bending the transmission line layer may be effected with the technique described in non-prepublished application EP 02078208.2 (PHNL020719) which is incorporated by reference.

In a further embodiment the substrate comprises a multitude of mutually independent metallizations and a multitude of transmission lines is defined in the transmission line layer. The combination of substrate, isolating material and carrier is then separated into individual electronic devices. If the carrier layer is removed, separation will not take place until after that. The advantage of the embodiment is that the devices are manufactured at plate level. This saves a large amount of assembly costs. A requirement for this is of course that the tolerance in lateral direction for substrate and carrier is largely and preferably substantially equal. Such an accuracy of dimensioning is preferably realized by keeping the thickness of the electroconductively patterned layer small, preferably less than 30 μm.

It is a second object of the invention to provide an electronic device of the type defined in the opening paragraph in which coils and other transmission lines can be easily integrated with the device without the need to make use of the second side of the substrate.

The second object is achieved in that the inductive element is defined in an electroconductive patterned layer which is situated on the first side of the substrate and is electroconductively connected to the metallization, between which substrate and the patterned layer isolating material is present in which isolating material the patterned layer is mechanically embedded.

In the device according to the invention the isolating material is not only a bonding agent but also a substrate for the inductive element. In this way the inductive coupling and parasitic capacitance to the further elements is strongly reduced. At the same time the substrate surface relative to the existing solution has at least remained the same. In addition, the device can be handled very well, because the second side of the substrate need not be provided with patterns and there is no need for connections to be made through the substrate. On the contrary, the isolating material not only serves as a bonding agent and as a substrate for the inductive element but as the protective layer for the semiconductor elements and possibly other elements on the first side of the substrate. Examples of inductive elements are, for example, coils, waveguides, couplers, strip lines etc. It goes without saying that more than one inductive element may be defined in the patterned layer.

It is an advantage of the invention that the patterned layer can be applied in combination with any substrate. Examples are semiconductor substrates of III-V materials such as GaAs and InP; silicon SiC and SiGe substrates which are not etched or ground back; polymer or ceramic substrates on which thin-film transistors are defined or on which electrical elements are assembled. The electrical elements are preferably semiconductor elements such as transistors, diodes and integrated circuits, but may also be micro-electromechanical system elements (MEMS), resonators and capacitors. The use of a semiconductor substrate of a III-V material with semiconductor elements such as HBTs and PHEMTs as electrical elements is extremely favorable.

In a favorable embodiment the patterned layer extends from the substrate in a plane parallel to the first side and has contact pads for external contacting of the electronic device, the isolating material actually completely enveloping the substrate. The patterned layer here performs a further function that is that of lead frame whereas the isolating material is also the envelope. This can be realized very well if the contact pads are present in essence in a ring around the inductive element.

In another embodiment the patterned layer is present between the isolating material and additional layers in which, for example, vertical interconnect areas (vias) are defined. In this embodiment the patterned layer is integrated with an extended interconnect structure. If the patterned layer has a small thickness of the order of several micrometers, dielectrical and conductive layers can easily be realized with thin-film techniques. Besides vias it is also possible to define capacitors in this way, with one electrode being accommodated in the transmission line layer. The uniformity of the field of such a capacitor is ensured by applying an isolating layer that is present within the edges of the one electrode. This is further described in non-prepublished application EP 01203071.4 (PHNL010579).

In a further embodiment the patterned layer is bent so that there is contact between the metallization and the patterned layer at the first point and the inductive element is located in a plane substantially running parallel to the first side at a predefined distance. Setting the distance between the inductive element and the substrate is highly advantageous in that the inductive and capacitive coupling can be set very well. Bending the patterned layer may be effected with a technique described in non-prepublished application EP 02078208.2 (PHNL020719) which is incorporated herein by reference.

In a variant, which is highly favorable in combination with the latter embodiment, the metallization has an inductive element on a boundary face with the isolating material. This inductive element is substantially opposite the inductive element in the patterned layer, which inductive elements together form a strip line. Examples of strip lines are, for example, two-winding coils, transformers, resonators and couplers. Such strip lines which are present on two substrates are known per se from U.S. Pat. No. 6,060,968. In the case described there, one of the substrates is an isolating substrate such as a printed circuit board. The disadvantage of this is that the strip line comprises two parts which are manufactured by different manufacturers: the printed circuit board manufacturer and the manufacturer of the electrical element. Such a disadvantage is there for the co-planar waveguide structures which are known from WO-A 02/01631 and are incorporated herein by reference. The strip line in the device according to the invention, however, may be manufactured as a whole by the manufacturer of the device.

These and other aspects of the invention are apparent from and will be elucidated with reference to the embodiments described hereinafter.

Figure 2:
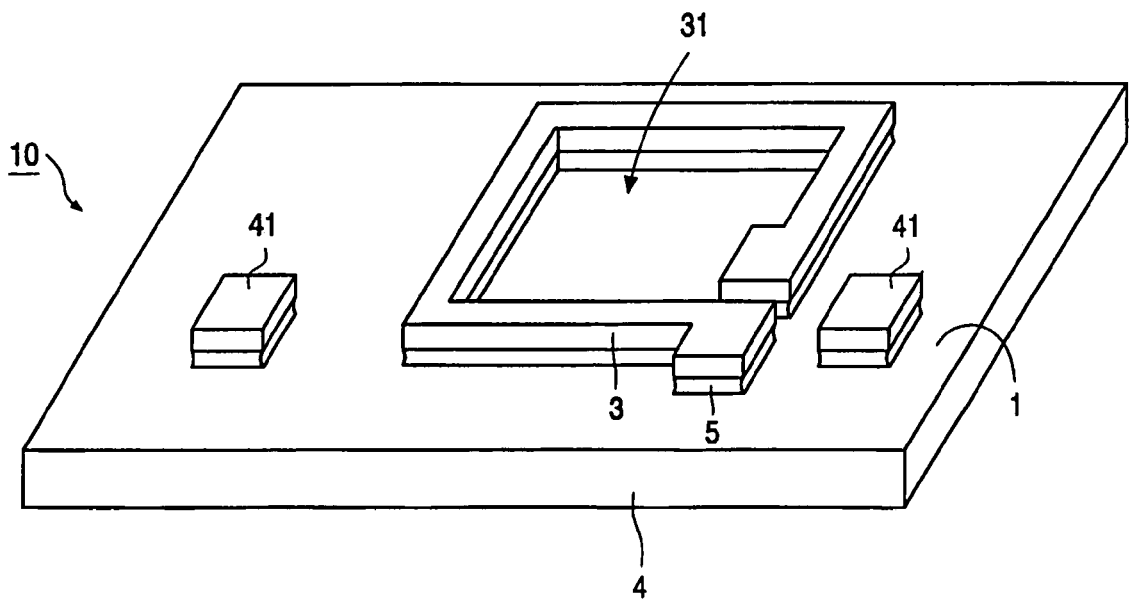
Figure 3:
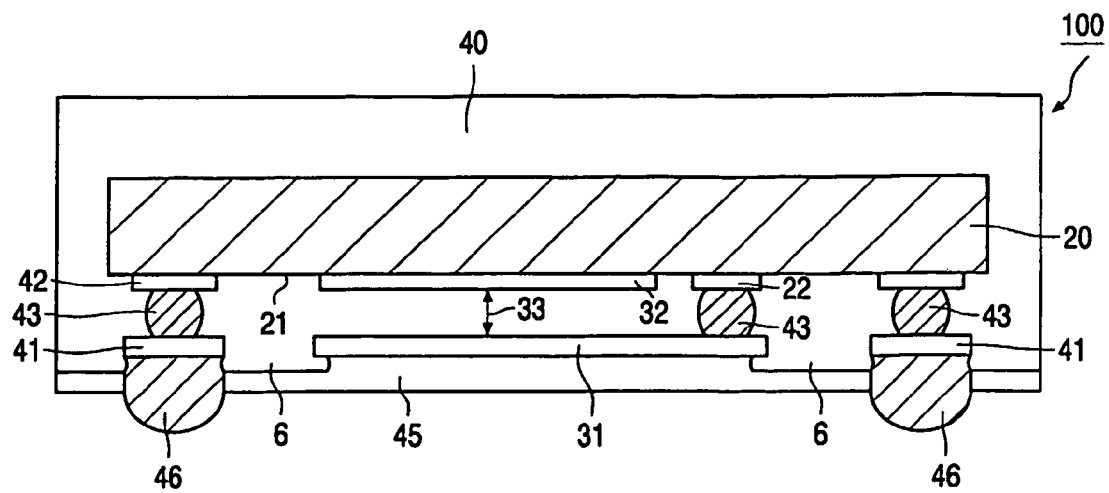
Figure 4:
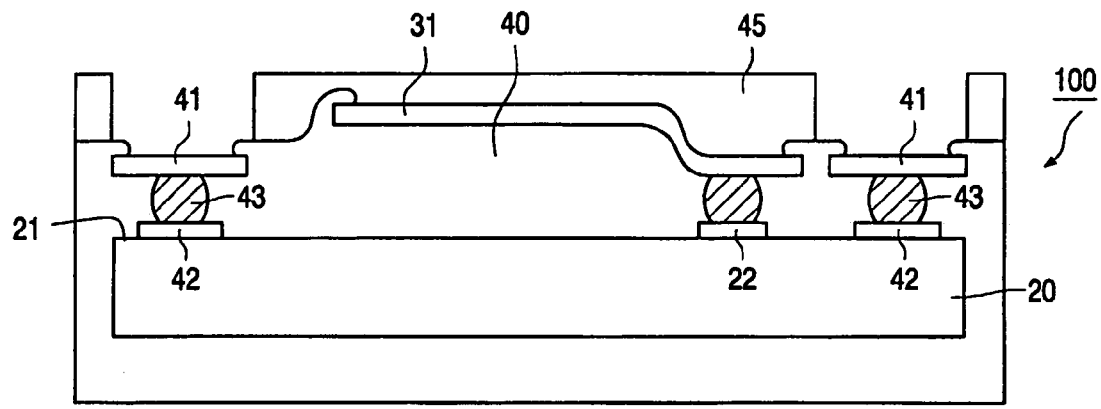
Figure 5:
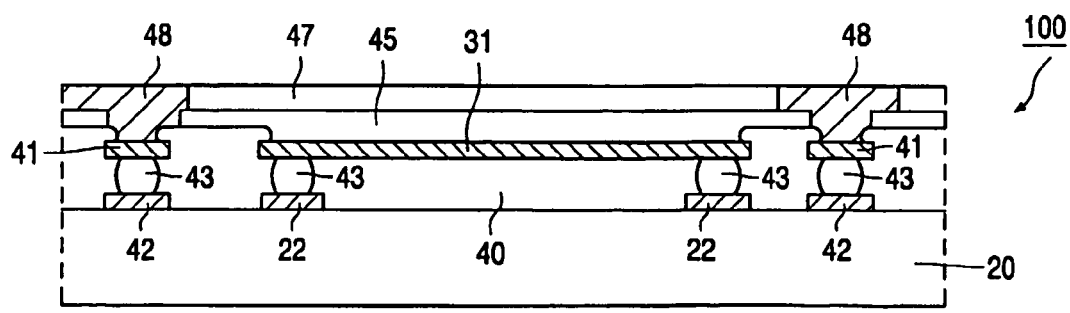

In the drawings:

FIG. 1 gives a diagrammatic cross-sectional view of a carrier which is suitable for application in the method;

FIG. 2 shows the carrier of FIG. 1 in a bird's eye view;

FIG. 3 gives a diagrammatic cross-sectional view of a first embodiment of the device in which the carrier shown in FIG. 1 is applied;

FIG. 4 gives a diagrammatic cross-sectional view of a second embodiment of the device; and FIG. 5 gives a diagrammatic cross-sectional view of a third embodiment of the device.

The Figures are not shown to scale and several dimensions are shown in exaggerated form for clarity. Like areas or parts carry as much like reference characters as possible.

FIG. 1 shows diagrammatically in cross-section a carrier 10 as applied in the method according to the invention. FIG. 2 shows diagrammatically and in a bird's eye view the carrier of FIG. 1. In this example, but this is not essential, the carrier 10 has a first side 1 and a second side 2, a patterned layer 3 on the first side 1 and a carrier layer 4 on the second side. A sub-layer 5, which in this embodiment is part of the carrier layer 4, is in contact with the patterned layer 3. The patterned layer 3 and the sub-layer 5 contain a number of patterns separated by recesses 6. The recess 6 has in the plane of the sub-layer 5 a larger diameter than in the plane of the patterned layer 3. The carrier layer 4 is here an aluminum layer having a thickness of about 60 μm. The patterned layer 3 contains copper and has a thickness of about 10 μm. In the patterned layer 3 are defined contact pads 41 and a winding 31. Where there are only two contact pads 41 in the drawing, the expert will understand that normally there are a larger number of contact pads i.e. at least three for a transistor and a large number for an integrated circuit.

The carrier is manufactured as follows: by means of photolithography a halter mask of silicon dioxide is formed after which outside this mask the copper is removed from the patterned layer 3 by means of etching with a watery solution of ferrichloride. During this process a recess 6 is formed in the carrier 10. Then part of the carrier layer 4 is removed with another, selective etching agent. Then underetching of the carrier layer 4 relative to the patterned layer 3 takes place, while a sub-layer 5 is formed. For example a caustic soda solution can be used as a selective etching agent for aluminum.

The resulting device 100, which is shown in FIG. 3, arises after assembly of the carrier 10 with a substrate 20 and several sequential steps. Prior to the assembly solder bumps 43 are provided on the contact faces 42 and track 22 on the metallization side 21 of the substrate 20. In lieu of solder bumps 43 it is also possible to apply, for example, Au bumps. In that case it is favorable to provide the contact faces 41, 42 with an adhesive layer, for example of Ag. The carrier 10 may also be provided with a fluid layer to keep the solder bumps 43 in shape. Use of such a liquid layer is described in non-prepublished application EP 02077228.1 (PHNL020471) which is incorporated herein by reference. During assembly, the solder bumps 43 are brought into contact with contact pads 41 and the coil 31. Alignment of the carrier and the substrate takes place with the aid of mechanical aligning means which are provided in the patterned layer 3 of the carrier 10 and the metallization of the substrate 20. Alternatively, the alignment may be effected, for example, with light.

Subsequent to assembly, isolating material 40 is inserted between the carrier 10 and the substrate 20 and around the substrate 20. In this example an epoxy is used as isolating material. Capillary forces, possibly supplemented with a vacuum treatment, provide that the epoxy fills the space and also the recesses 6. After the filling operation, an additional heating step is applied to harden the isolating material 40.

Subsequently, the carrier layer 4 is removed, which is effected by etching with caustic soda solution. Then a protective layer 45 of preferably the same isolating material is applied. The device 100 in the Figure also comprises solder bumps 46 and is thereby suitable for being disposed on a substrate. In lieu of removing the aluminum and replacing same by an isolating material, for example a silicon substrate with a rather thick $SiO_2$ layer on the surface may be used as a carrier layer. The carrier layer then only needs to be partly removed —that is only the Si substrate—so that the $SiO_2$ remains as the protective layer 45. The holes therein can be provided thereafter, but also already before the assembly of the carrier.

The device shown in FIG. 3 comprises a substrate 20 with a coil 32 on the metallization side 21. The winding 32 is situated at a distance 33 from the winding 31. The two windings 31, 32 may be interconnected, so that a two-winding coil is formed. The windings, however, may also be part of a transformer. The two-winding coil has a higher induction. Obviously, in lieu of a two-winding coil, another functional two-layer component may be defined in similar manner. It is likewise possible to choose an isolating material filled with magnetic material for the isolating material 40. However, it is then favorable to provide a different isolating material around the substrate 20 than between the substrate 20 and the carrier 10.

FIG. 4 shows a second embodiment of the device 100. The carrier 10 is then deformed prior to assembly and comprises a single-layer functional element 31, in this case a coil. An advantage of the deformation is that the functional element 31 is positioned at a very well-defined predetermined distance from the substrate 20. Another advantage of the deformation is that the functional element 31 is further away from the substrate 20 than the contact pads 41. As a result, there is less parasitic interaction between the substrate 20 and the functional element 31. The functional element is then provided with a protective layer 45 for which benzocyclobutene is chosen in this case.

Alternatively, it may be advantageous to position the functional element 31 at a smaller distance from the substrate 20. The advantage of this is that an additional protective layer 45 is not necessary. This particularly holds for the cases where the contact pads 41 have a much larger width than the functional element 31. By setting the degree of underetching there may be achieved that the isolating material 40 largely envelops the functional element. The contact pads 41 having the much larger dimensions continue to be on the side turned away from the substrate 20 but largely remain free from isolating material 40.

The deformation takes place after the recesses 6 have been provided in the patterned layer 3 and after an etching agent has been applied for partly etching the carrier layer 4 while the sub-layer 5 is being formed. A mold having a desired pattern existing for example of Ni/Au bumps on a Si substrate is brought into contact with the carrier 10 for the deformation, while this carrier 10 is located on a hard underground. The mold may be located both on the second side 2 and on the first side 1 of the carrier 10.

FIG. 5 shows a third embodiment of the device 100 according to the invention. The device 100 shown is manufactured on plate level where the substrate 20 and the carrier 10 are assembled for separation of substrate 20 or carrier 10 for individual devices. The result of this is, for example, that the isolating material 40 is only applied between the substrate 20 and the carrier 10. Preferably holes are present in the carrier to accelerate the supply of isolating material 40. After the carrier layer has been removed, in this example of embodiment a second protective layer 47 is deposited in addition to a first protective layer 45. Both layers 45, 47 have been patterned as desired and filled with copper by means of electroplating. In this process is applied the damascene technique on micrometer scale, which is known to the expert in the field of interconnects. The resulting device is suitable for mounting but also additional dielectrical and conductive layers may be applied, among which there are further elements, ground faces, thin-film capacitors etc.

Summarizing, a semiconductor device is provided having a semiconductor substrate 20 and a functional element 31, such as a microstrip, a coil, a coupler. The functional element 31 is then present in a conductive layer which is mechanically embedded in isolating material between the substrate 20 and the element 31. The functional element is subsequently electrically connected to the substrate 20 by connectors. In this way electrical losses in the substrate 20 are strongly reduced. The device 100 is favorably manufactured by applying a foil that has a conductive layer and a carrier layer to the substrate, after which the space between substrate and foil is filled with isolating material 40 and—preferably, the carrier layer is removed.

The invention claimed is:

1. An electronic device comprising a substrate with an electrical element on its first side which element comprises a first and a second electrode which are connected to a metallization by electrical contacts and electrodes of further electrical elements, the electronic device further comprising an inductive element, characterized in that the inductive element is defined in an electroconductive patterned layer which is located on the first side of the substrate and which is electroconductively connected to the metallization, isolating material being present between said substrate and the patterned layer in which isolating material the patterned layer has been mechanically embedded, wherein the isolating material is in contact with the substrate and the patterned layer and surrounds the substrate and the patterned layer.

2. The electronic device as claimed in claim 1, wherein the patterned layer extends in a plane parallel to the first side beyond the substrate and contact pads for external contacting of the electronic device and the isolating material substantially completely envelops the substrate.

3. The electronic device as claimed in claim 1, wherein the patterned layer is situated between the isolating material and additional layers in which vertical interconnect areas (vies) are defined.

4. The electronic device as claimed in claim 1, wherein the metallization along a boundary face with the isolating material includes further inductive element which is situated substantially opposite the inductive element in the patterned layer, the inductive element and the further inductive element together forming a strip line.

5. The electronic device as claimed in claim 1, wherein the substrate comprises a semiconductor material selected from the group of III-V and II-VI connectors and in that the electrical element is a semiconductor element.

6. The electronic device of claim 1, wherein a distance between the substrate and the inductive element is larger that a distance between the substrate and the electrical contacts.

7. The electronic device of claim 1, wherein the patterned layer is bent to place the inductive element in a plane substantially parallel to the first side and at a desired distance from the substrate, wherein the desired distance is larger that a distance between the substrate and the electrical contacts.

8. The electronic device of claim 1, wherein the patterned layer is bent to place the inductive element at a desired distance from the substrate, wherein the desired distance is larger that a distance between the substrate and the electrical contacts.

9. The electronic device of claim 1, wherein the electrical contacts have a larger width than a width of the inductive element.

* * * * *